(12) United States Patent
Habib et al.

(10) Patent No.: US 12,695,445 B2
(45) Date of Patent: Jul. 28, 2026

(54) SOLID-STATE BREAKER COORDINATION WITH DOWNSTREAM ELECTROMECHANICAL BREAKERS

(71) Applicant: ABB Schweiz AG, Baden (CH)

(72) Inventors: Hany Habib, Glen Allen, VA (US); Thomas Anthony Kendzia, III, Rockville, VA (US); Veerakumar Bose, Henrico, VA (US)

(73) Assignee: ABB Schweiz AG, Baden (CH)

( * ) Notice: Subject to any disclaimer, the term of this patent is extended or adjusted under 35 U.S.C. 154(b) by 162 days.

(21) Appl. No.: 18/582,009

(22) Filed: Feb. 20, 2024

(65) Prior Publication Data

US 2025/0266820 A1     Aug. 21, 2025

(51) Int. Cl.
*H03K 17/081*     (2006.01)
(52) U.S. Cl.
CPC .............................. *H03K 17/08116* (2013.01)
(58) Field of Classification Search
CPC .. H03K 17/08116; H01H 9/547; H02H 9/025; H02H 3/025; H02H 7/262; H02J 3/0073
USPC ........................................................ 361/93.9
See application file for complete search history.

(56) References Cited

U.S. PATENT DOCUMENTS

| | | | | | |
|---|---|---|---|---|---|
| 11,799,467 | B2 * | 10/2023 | Sievers | .................. | H03K 17/18 |
| 2017/0141558 | A1 * | 5/2017 | Waldron | ................ | H02H 3/033 |
| 2019/0341213 | A1 * | 11/2019 | Kouroussis | ............ | H02H 3/165 |

FOREIGN PATENT DOCUMENTS

| | | | | | |
|---|---|---|---|---|---|
| GB | | 2617604 A | * 10/2023 | ............ | H10W 90/00 |

* cited by examiner

*Primary Examiner* — Sreeya Sreevatsa
(74) *Attorney, Agent, or Firm* — McCarter & English, LLP

(57) ABSTRACT
A solid-state circuit breaker includes an input, an output, a solid-state switch, a protection circuit, and a control circuit. The input is configured to connect to a source. The output is configured to couple with at least a first load via a first electromechanical breaker and a second load via a second electromechanical breaker. The solid-state switch selectively couples the input with the output. The protection circuit is configured to open the solid-state switch in response to the fault current exceeding an overcurrent protection threshold. The control circuit is configured to determine whether an electrical fault is present, and in response to determining that the fault is present, operate the solid-state switch in a pulse conduction mode during the fault to current-limit the fault current to less than the overcurrent protection threshold and enable one of the first and second electromechanical breakers to trip and isolate the fault.

20 Claims, 5 Drawing Sheets

100

SiC
104

Downstream
Breaker      102

Current

100K

10K

1K

100

10

1A

100

10

1

100

10

Time

*FIG. 2*

SOLID-STATE BREAKER COORDINATION WITH DOWNSTREAM ELECTROMECHANICAL BREAKERS

BACKGROUND

The field of the disclosure relates to solid-state circuit breakers, and in particular, to solid-state circuit breakers that operate during downstream electrical faults to ensure that downstream electromechanical breakers can trip and isolate the faults.

Solid state circuit breakers utilize solid-state switches to selectively conduct current between their inputs and outputs. In some cases, the solid state circuit breakers utilize solids state switches that have a limited ability to survive overcurrent conditions, such as may arise during electrical faults downstream of the solid-state circuit breakers. In order to protect these types of solid-state switches, the solid-state circuit breakers operate to quickly turn off their solid-state switches during downstream faults (e.g., within tens of microseconds) in order to protect the solid-state switches from damage.

Problems arise, however, when the power distribution system downstream of the solid-state circuit breaker includes both heathy zones (where a fault is not present) and faulted zones (where faults are present). Due to the short time during a downstream electrical fault before the solid-state breaker turns off, breakers downstream of the solid-state circuit breaker (e.g., breakers used to isolate the faulted zones) may have insufficient time to trip and isolate the electrical fault. The result is that both the healthy zones and the faulted zones are disconnected when the upstream solid-state circuit breaker trips open faster than the downstream breakers can trip.

Thus, it is desirable to improve the operation and performance of solid-state circuit breakers during downstream electrical faults in order to minimize the downtime of healthy zones.

BRIEF DESCRIPTION

In one aspect, a solid-state circuit breaker configured to current-limit a fault current during an electrical fault is provided. The solid-state circuit breaker includes an input, an output, a solid-state switch, a protection circuit, and a control circuit. The input is configured to connect to a source. The output is configured to couple with at least a first load via a first electromechanical breaker and a second load via a second electromechanical breaker. The solid-state switch selectively couples the input with the output. The protection circuit is communicatively coupled with the solid-state switch and is configured to open the solid-state switch in response to the fault current exceeding an overcurrent protection threshold. The control circuit is communicatively coupled with the solid-state switch and is configured to determine whether the electrical fault is present, and in response to determining that the electrical fault is present, operate the solid-state switch in a pulse conduction mode during the electrical fault to current-limit the fault current to less than the overcurrent protection threshold and enable one of the first and second electromechanical breakers to trip and isolate the electrical fault.

In another aspect, a method operable by a solid-state circuit breaker for current-limiting a fault current during an electrical fault is provided. The solid-state circuit breaker includes an input, an output, a solid-state switch, a protection circuit, and a control circuit. The input is configured to connect to a source. The output is configured to couple with at least a first load via a first electromechanical breaker and a second load via a second electromechanical breaker. The solid-state switch selectively couples the input with the output. The protection circuit is communicatively coupled with the solid-state switch and is configured to open the solid-state switch in response to the fault current exceeding an overcurrent protection threshold. The method comprises determining whether the electrical fault is present, and in response to determining that the electrical fault is present, operating the solid-state switch in a pulse conduction mode during the electrical fault to current-limit the fault current to less than the overcurrent protection threshold and enable one of the first and second electromechanical breakers to trip and isolate the electrical fault.

In another aspect, a static transfer switch configured to current-limit a fault current during an electrical fault is provided. The static transfer switch includes first and second inputs, an output, first and second power stages, at least one protection circuit, and a control circuit. The first and second inputs are configured to couple with first and second power sources, respectively. The output is configured to couple with at least a first load via a first electromechanical breaker and a second load via a second electromechanical breaker. The first and second power stages are configured to conduct electrical power when active, where the first power stage is configured to selectively couple the first input with the output, and where the second power stage configured to selectively couple the second input with the output. The at least one protection circuit is configured to deactivate one of the first and second power stages in response to the fault current exceeding an overcurrent protection threshold. The control circuit is communicatively coupled with the first and second power stages and is configured to determine whether the electrical fault is present, and in response to determining that the electrical fault is present, operate one of the first and second power stages in a pulse active mode during the electrical fault to current-limit the fault current to less than the overcurrent protection threshold until one of the first and second electromechanical breakers trips and isolates the electrical fault.

BRIEF DESCRIPTION OF DRAWINGS

These and other features, aspects, and advantages of the present disclosure will become better understood when the following detailed description is read with reference to the accompanying drawings in which like characters represent like parts throughout the drawings.

FIG. 2 depicts a block diagram of a solid-state circuit breaker in an exemplary embodiment.

Figure 1:
FIG. 1 depicts graph illustrating different operating times for an electromechanical breaker and a silicon carbide metal-oxide-semiconductor field-effect transistor based solid-state circuit breaker at different currents in an exemplary embodiment.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc—read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are not intended to limit in any way the definition and/or meaning of the term processor and processing device.

Solid-state circuit breakers may utilize overcurrent protection circuits to protect the solid-state switches during overcurrent conditions that arise, for example, during downstream electrical faults. For example, solid-state circuit breakers that utilize silicon carbide metal-oxide-semiconductor field-effect transistors (SiC MOSFETs) or insulated-gate bipolar transistor (IGBTs) as solid-state switches may include overcurrent protection circuits that quickly turn the solid-state switches off when a downstream electrical fault occurs in order to protect the solid-state switches from damage that arises when SiC MOSFETs and IGBTs are subjected to overcurrent conditions.

Although the overcurrent protection circuits operate to prevent damage to the solid-state switches, the near instantaneous action of opening the solid-state switch (e.g., within less than about 20 microseconds) may not provide sufficient time for downstream breakers to trip and isolate the electrical fault. The result is that both healthy zones and faulted zones are disconnected from their upstream source when the overcurrent protection circuits trip the upstream solid-state breakers.

FIG. 1 depicts a graph 100 illustrating different operating times for an electromechanical breaker 102 and a SiC MOSFET based solid-state circuit breaker 104 (SiC-SSCB) at different currents in an exemplary embodiment. The power distribution configuration associated with graph 100 has SiC-SSCB 104 upstream of electromechanical breaker 102. The currents in this configuration as illustrated in series through both the SiC MOSFET of SiC-SSCB 104 and electromechanical breaker 102.

As illustrated in graph 100, current that flows through both the downstream electromechanical breaker 102 and the SiC MOSFET of SiC-SSCB 104 that is less than about one hundred amps does not trip either the downstream electromechanical breaker 102 or activate the overcurrent protection circuit for the SiC MOSFET of SiC-SSCB 104. Current that flows through both the downstream electromechanical breaker 102 and the SiC MOSFET of SiC-SSCB 104 that is less than about six hundred amps does not trigger the overcurrent protection circuit for the SiC MOSFET, and the current continues to flow through both the downstream electromechanical breaker 102 and the SiC MOSFET of SiC-SSCB 104 for sufficient time (e.g., ten to twenty milliseconds) to enable the downstream electromechanical breaker 102 to trip open. However, if the current through both the downstream electromechanical breaker 102 and the SiC MOSFET of SiC-SSCB 104 is higher than the overcurrent protection activation threshold for the SiC MOSFET (e.g., higher than about six hundred amps in this example), then the overcurrent protection circuit activates and turns the SiC MOSFET of SiC-SSCB 104 off nearly instantly (e.g., in less than about twenty microseconds), which is not enough time for the downstream electromechanical breaker 102 to trip open.

In one embodiment, solid-state circuit breakers are described that, during downstream electrical faults, operate in a pulse conduction mode during the electrical fault to (i) provide sufficient time for downstream breakers to open and isolate the faulted zones; and (ii) continue to supply power to the healthy zones during the electrical fault. During the pulse conduction mode, the solid-state switch is operated to maintain the current through the solid-state switch to less than a threshold current that would trigger the overcurrent protection circuits to activate, thereby ensuring that the solid-state circuit breaker does not open and disconnect healthy downstream zones. Once the downstream breaker of the faulted zone trips and isolates the electrical fault, the solid-state circuit breaker discontinues the pulsed conduction mode of operation and operates normally in a conducting state (e.g., the solid-state switch remains on rather than cycling on and off as compared to during the electrical fault). The result is that the faulted zone is isolated, and the healthy zones remain powered both during the electrical fault and subsequent to the electrical fault. This improves the uptime of the downstream power distribution system and provides advantages over the current state of the art.

Figure 2:
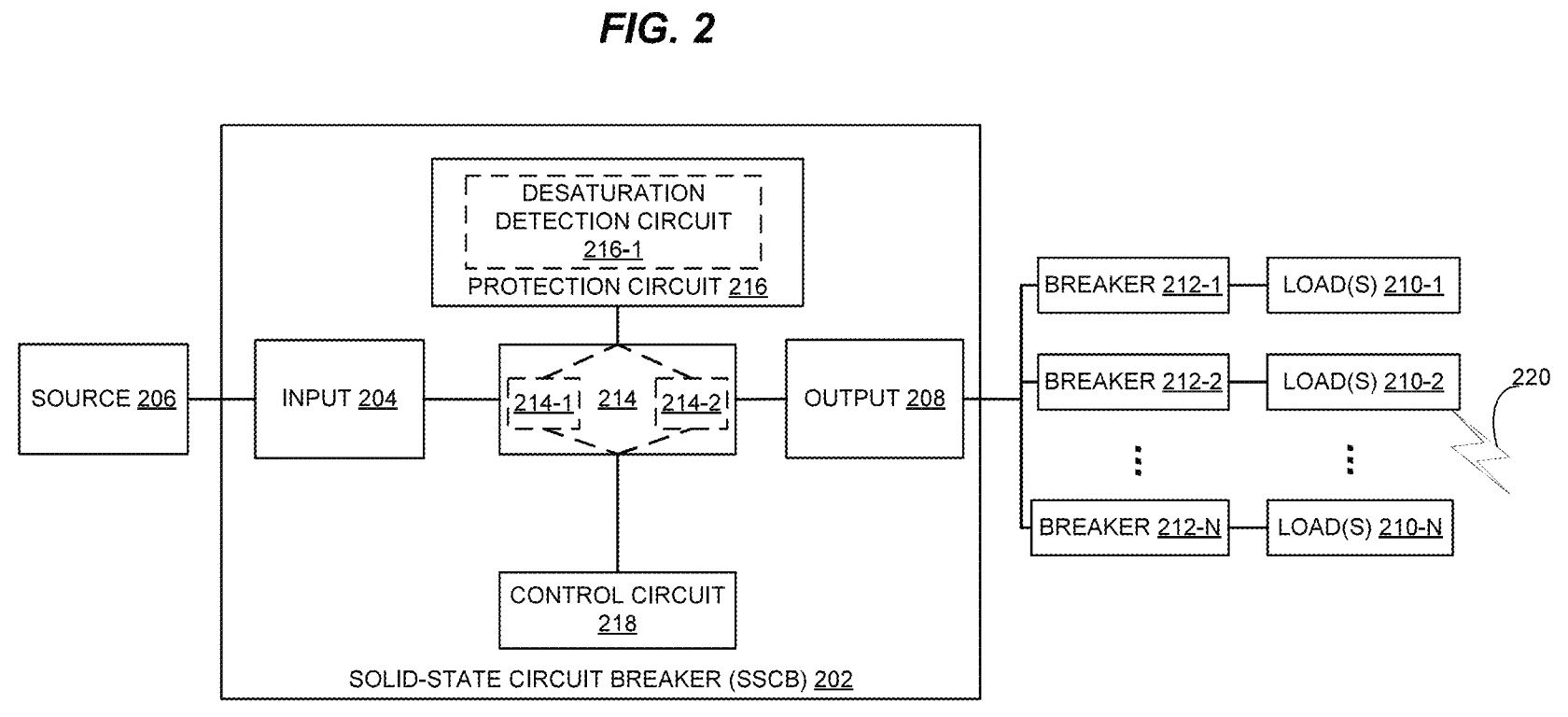

FIG. 2 depicts a block diagram of a solid-state circuit breaker (SSCB) 202 in an exemplary embodiment. SSCB 202 will be described with respect to various discrete elements, which perform functions. These elements may be combined in different embodiments or segmented into different discrete elements in other embodiments.

In this embodiment, SSCB 202 includes an input 204 that is configured to connect to a source 206 and an output 208 that is configured to couple with a plurality of loads 210 via respective breakers 212. Although FIG. 2 depicts output 208 coupled with three loads 210-1, 210-2, 210-N via three respective breakers 212-1, 212-2, 212-N, output 208 may be coupled to any number of loads 210 via their respective breakers 212 on other embodiments, with N being an arbitrary number of loads 210 and breakers 212. In some embodiments, breakers 212 comprise electromagnetic breakers, or other types of breakers, which trip open in response to conducting a pre-determined trip current. In some embodiments, breakers 212 may require at least ten milliseconds to trip open when conducting their trip current (s).

In this embodiment, SSCB 202 further includes a solid-state switch 214 that selectively couples input 204 with output 208. For example, solid-state switch 214 may conduct current between source 206 and loads 210 in response to a control signal applied to solid-state switch 214, and may become electrically non-conducting in response to the control signal being removed. The control signal may, for example, comprise a variable voltage gate control signal, a variable current control signal, etc., which is used to modify the conduction state of solid-state switch 214. In some embodiments solid-state switch 214 includes multiple solid-state switches 214-1, 214-2 electrically coupled in series and/or parallel. For example, solid-state switch 214 may comprise one or more series and/or parallel combinations of SiC MOSFETs, IGBTs, etc. Generally, solid-state switch 214 comprises any component, system, or device that selectively conducts current between input 204 and output 208 in response to a control signal, such as a current or voltage signal.

In this embodiment, SSCB 202 further includes a protection circuit 216 communicatively coupled with solid-state switch 214. Protection circuit 216 comprises any component, system, or device that opens (e.g., renders electrically non-conducting) solid-state switch 214 in response to a current equaling or exceeding an overcurrent protection threshold. For example, protection circuit 216 may be configured to open solid-state switch 214 (e.g., protection circuit 216 intercepts and modifies the control signal that modifies the conduction/non-conduction state of solid-state switch 214) in response to a downstream electrical fault (e.g., an electrical fault downstream of output 208 that results in an abnormally high short-circuit current through solid-state switch 214). When the current flowing through solid-state switch 214 is less than the overcurrent protection threshold, protection circuit 216 may not take an action to modify the operation of solid-state switch 214 (e.g., protection circuit 216 does not modify the control signal applied to solid-state switch 214 unless the current through solid-state switch 214 equals or exceeds the overcurrent protection threshold). For instance, if the overcurrent protection threshold is six hundred amps, then protection circuit 216 may not override the conduction state of solid-state switch 214 unless the current through solid-state switch 214 is six hundred amps or greater, at which point protection circuit 216 overrides the control signal(s) applied to solid-state switch 214 to open (render electrically non-conducting for current) solid-state switch 214. In some embodiments, protection circuit 216 comprises a desaturation detection circuit 216-1, which operates to quickly turn off solid-state switch 214 when the current through solid-state switch 214 is equal to or higher than the overcurrent protection threshold. When protection circuit 216 comprises desaturation detection circuit 216-1, protection circuit 216 detects a rise of a collector or drain voltage of solid-state switch 314 when an overcurrent flows through solid-state switch 214.

In this embodiment, SSCB 202 further includes a control circuit 218 that is communicatively coupled with solid-state switch 214. Control circuit 218 comprises any component, system, or device that modifies the conduction state of solid-state switch 214 in response to various detected criteria. During normal operation, control circuit 218 closes, turns on, renders electrically conducting, etc., solid-state switch 214 such that loads 210 are connected to source 206 (e.g., via a series conduction path that includes input 204, solid-state switch 214, and output 208) unless a command is provided to control circuit 218 to open, turn off, render electrically non-conducting, etc., solid-state switch 214 such that loads 210 are no longer connected to source 206. A command to open or close solid-state switch 214 may be provided by an external system (not shown) and/or by an operator (not shown). The normal operating state of SSCB 202 may be to maintain solid-state switch 214 closed unless an external command is received, or unless a downstream electrical fault is detected by control circuit 218 that results in an abnormally high current conducted through solid-state switch 214.

A downstream electrical fault may be detected by control circuit 218 in a number of different ways. In some embodiments, control circuit 218 compares the current through solid-state switch 214 with a pre-defined current, and determines that a downstream electrical fault is occurring if the current through solid-state switch 214 is equal to or exceeds the pre-defined current. The pre-defined current for detecting a downstream electrical fault is higher than the normal operating current or rated current of SSCB 202, and may be pre-set or variable in different embodiments. In other embodiments, control circuit 218 detects an abnormally high rate of change ($di/dt$) for the current conducted through solid-state switch 214, and determines that a downstream electrical fault is occurring if the $di/dt$ through solid-state switch exceeds a pre-defined rate. The pre-defined $di/dt$ for detecting a downstream electrical fault is higher than the normal operating $di/dt$ of SSCB 202 (e.g., the maximum di/dt expected due to the inrush current when loads 210 are initially powered), and may be pre-set or variable in different embodiments. In other embodiments, control circuit 218 may use a combination of a pre-defined current and a pre-defined di/dt to detect downstream electrical faults.

As discussed above, during an electrical fault downstream of SSCB 202, such as electrical fault 220 illustrated for load 210-2, the current conducted by solid-state switch 214 begins to rise at an abnormal rate and value due to electrical fault 220. Electrical fault 220 may comprise phase-to-phase faults, phase-to-ground faults, or other types of faults that result in abnormally high currents through SSCB 202.

In order to prevent protection circuit 216 from triggering and opening solid-state switch 214, which would disconnect both healthy loads 210-1, 210-N, along with faulted load 210-2, control circuit 218 is configured to vary a conduction time of solid-state switch 214 during electrical fault 220 to current-limit the fault current to less than the overcurrent protection threshold. For instance, if the overcurrent protection threshold for protection circuit 216 is six hundred amps, then control circuit 218 varies the conduction time of solid-state switch 214 to limit the current through solid-state switch 214 to less than six hundred amps. Control circuit 218 may be pre-configured to limit the current through solid-state switch 214 to a pre-defined value (e.g., five hundred amps) that is less than the overcurrent protection threshold. While control circuit operates to vary the conduction time of solid-state switch to current-limit the fault current below the overcurrent protection threshold, non-faulted loads 210-1, 210-N remain powered by SSCB 202 via their respective breakers 212-1, 212-N. Breaker 212-2, which is subjected to the higher than normal fault current due to electrical fault 220, trips open after some amount of time (e.g., ten to twenty milliseconds), which disconnects electrical fault 220 from SSCB 202 and isolates electrical fault 220.

Figure 3A:
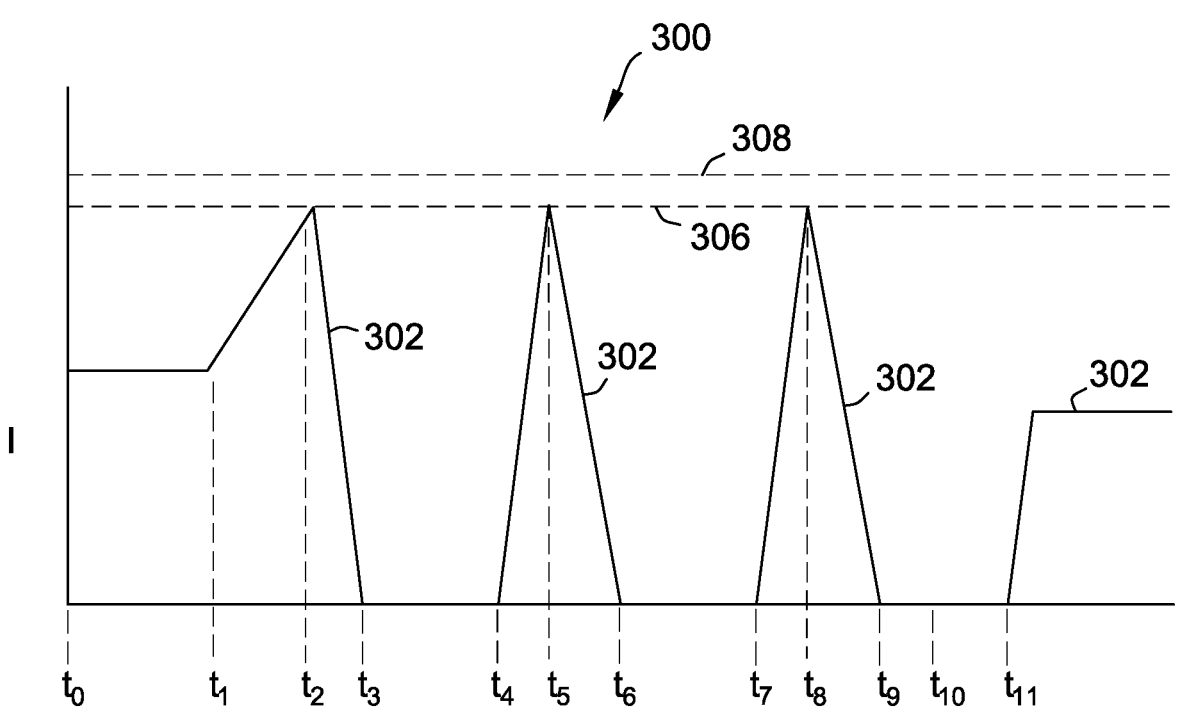
FIG. 3A depicts a graph of a current through a solid-state switch of a solid-state circuit breaker while current-limiting a fault current during an electrical fault in an exemplary embodiment.
Figure 3B:
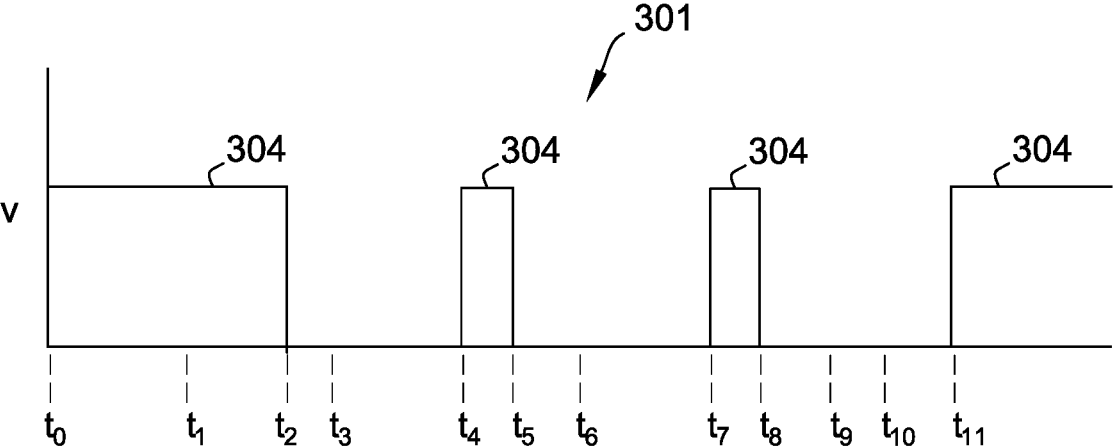
FIG. 3B depicts a graph of a voltage of a gate signal applied to a solid-state switch of a solid-state circuit breaker while current-limiting a fault current during an electrical fault in an exemplary embodiment.

FIG. 3A depicts a graph 300 of a current 302 through solid-state switch 214 while current-limiting the fault current during an electrical fault in an exemplary embodiment. FIG. 3B depicts a graph 301 of a voltage of a gate signal 304 applied to solid-state switch 214 while current-limiting the fault current during an electrical fault in an exemplary embodiment. FIGS. 3A and 3B illustrate various events at times $t_0$-$t_{11}$ that represent the same time in both of graphs 300, 301. Although graph 301 depicts a gate signal 304 applied to solid-state switch 214, other types of control signals (e.g., a current signal) may be used control the conduction state of solid-state switch 214.

At $t_0$, SSCB 202 is operating normally, with solid-state switch 214 closed and source 206 supplying electrical power to loads 210. Gate signal 304 is high. At $t_1$, electrical fault 220 (see FIG. 2) occurs and current 302 through solid-state switch 214 begins increasing. At $t_2$, the current reaches a pre-defined current threshold 306 that is less than an overcurrent protection threshold 308, where overcurrent protection threshold 308 is a current threshold that would trigger protection circuit 216 to override gate signal 304 (e.g., force gate signal 304 low) and open solid-state switch 214. At $t_2$, control circuit 218 sets gate signal 304 low, which causes solid-state switch 214 to open. Current 302 decreases from $t_2$ to $t_3$ as solid-state switch 214 opens. At $t_4$, control circuit 218 sets gate signal 304 high, which causes solid-state switch 214 to close. Again, current 302 through solid-state switch 214 increases as solid-state switch 214 closes, until $t_5$ where current 302 reaches pre-defined current threshold 306. At $t_5$, control circuit 218 sets gate signal 304 low, which causes solid-state switch 214 to open. Current 302 decreases from $t_5$ to $t_6$ as solid-state switch 214 opens. At $t_7$, control circuit 218 sets gate signal 304 high, which causes solid-state switch 214 to close. Current 302 through solid-state switch 214 increases as solid-state switch 214 closes, until $t_8$ where current 302 reaches pre-defined current threshold 306. At $t_8$, control circuit 218 sets gate signal 304 low, which causes solid-state switch 214 to open. Current 302 decreases from $t_8$ to $t_9$ as solid-state switch 214 opens.

At $t_{10}$, breaker 212-2 opens in response to the fault current generated by electrical fault 220. In response to breaker 212-2 opening, control circuit 218 sets gate signal 304 high at $t_{11}$, which closes solid-state switch 214. Current 302 increases at $t_{11}$ but remains below pre-defined current threshold 306. With electrical fault 220 isolated by breaker 212-2, control circuit 218 keeps solid-state switch 214 closed. Further, the time delay between $t_3$ and $t_4$, and the time delay between $t_6$ and $t_7$, may be adjusted based on a desired time that current 302 will remain at zero amps. In some embodiments, these delays where current 302 is zero amps may be between about five hundred microseconds to about one millisecond. This delay may be adjusted depending on the type of breakers 212, such that breakers 212 will trip open as control circuit 218 operates solid-state switch 214 in the pulse conduction mode until breakers 212 trip and isolate the downstream electrical fault.

The time from $t_2$, where the electrical fault is detected and $t_{10}$, where the electrical fault is isolated by breaker 212-2, control circuit 218 operates solid-state switch 214 in the pulse conduction mode, with gate signal 304 alternating between high and low values to cause solid-state switch 214 to alternate between electrically conducting and electrically non-conducting states. During the time from $t_2$ and after time $t_{11}$, loads 210-1, 210-N continue to be electrically powered by source 206, thereby improving the uptime of loads 210-1, 210-N when electrical fault 220 occurs.

In addition to the functionality described above for SSCB 202, SSCB 202 may, in some embodiments, utilize different current thresholds or different di/dt thresholds described above in order to temporarily operate solid-state switch 214 in a pulse conduction mode when electrical fault 220 is not present. For example, during startup, loads 210 may draw an inrush current that is less (in value and or in di/dt) than what would be detected as an electrical fault but more than normal, thereby allowing SSCB 202 to temporarily enter into a pulse conduction mode of operation in order to limit the inrush current to loads 210. This type of additional functionality for SSCB 202 may improve the reliability of SSCB 202 by limiting transient current events through SSCB 202.

Figure 4:
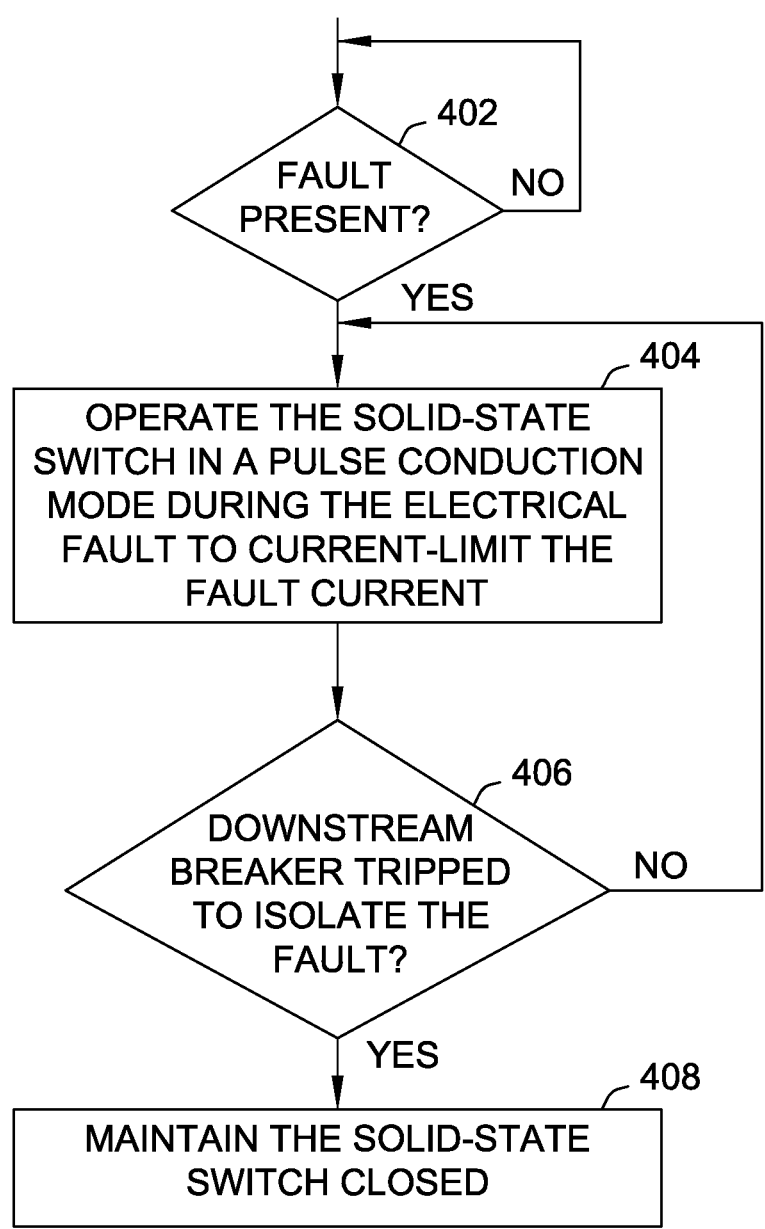
FIG. 4 depicts a flow chart of a method operable by a solid-state circuit breaker for current-limiting a fault current during an electrical fault in an exemplary embodiment.

FIG. 4 depicts a flow chart of a method 400 operable by a solid-state circuit breaker for current-limiting a fault current during an electrical fault in an exemplary embodiment. Method 400 will be discussed with respect to SSCB 202 of FIGS. 2, 3A, and 3B, although method 400 may apply to other configurations of solid-state circuit breakers, not shown.

Method 400 comprises determining 402 whether an a downstream electrical fault is present. For example, control circuit 218 determines whether electrical fault 220 is present, which may be performed in a number of different ways including but not limited to monitoring current 302 to determine if current 302 reaches current threshold 306, monitoring the di/dt of current 302 to determine if current 302 has a di/dt that is higher than a pre-defined rate, etc.

If an electrical fault is detected, method 400 further comprises operating 404 the solid-state switch in a pulse conduction mode during the electrical fault to current-limit the fault current to less than the overcurrent protection threshold. For example, control circuit 218 operates solid-state switch 214 in a pulse conduction mode (e.g., see FIG. 3B, gate signal 304 is generated as a series of pulses) during electrical fault 220 until breaker 210-2 trips to isolate electrical fault 220.

Method 400 further comprises determining 406 whether the downstream breaker has tripped to isolate the electrical fault, and maintaining 408 the solid-state switch closed in response to the downstream breaker tripping to isolate the electrical fault. For example, control circuit 218 keeps solid-state switch 214 closed by setting gate signal 304 high as depicted from time $t_{11}$ and later (see FIG. 3B).

Figure 5:
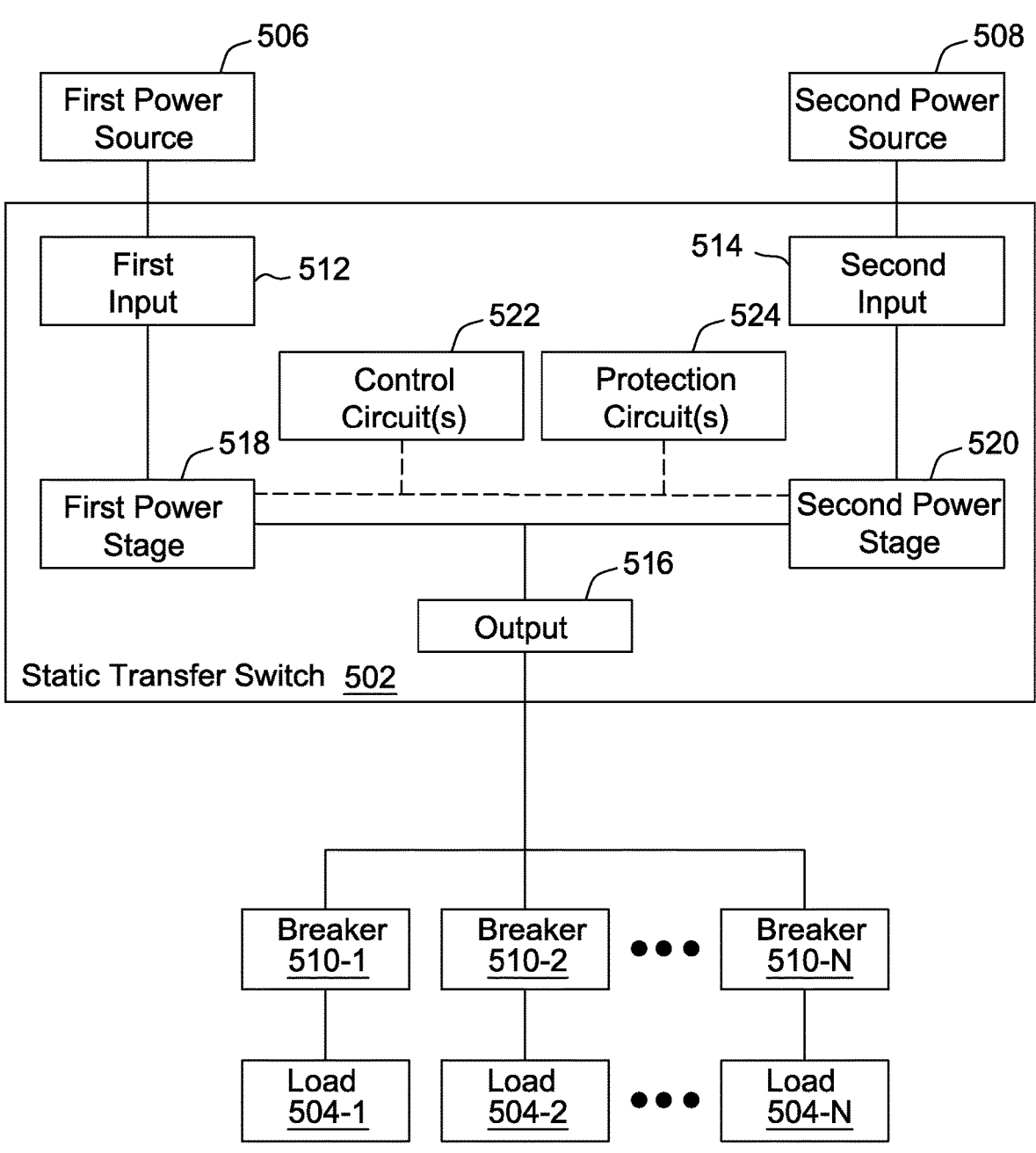
FIG. 5 depicts a static transfer switch that is configured to current-limit a fault current during an electrical fault in an exemplary embodiment.

FIG. 5 depicts a static transfer switch (STS) 502 that is configured to current-limit a fault current during an electrical fault in an exemplary embodiment. In this embodiment, STS 502 selectively supplies loads 504-1, 504-2, 504-N with electrical power from either a first power source 506 or a second power source 508 depending on various criteria. For example, STS 502 may supply electrical power to loads 504 primarily from first power source 506 unless the electrical power delivered by first power source 506 falls outside of a desired range of values (e.g., first power source 506 has a voltage, frequency, and/or a harmonic distortion that varies from target values by a threshold amount). If, for example, first power source 506 is incapable of supplying electrical power to loads 504 (e.g., first power source 506 fails or is incapable of supplying electrical power to loads 504 at a desired power quality), then STS 502 switches loads 504 from first power source 506 to a second power source 508. In this regard, first power source 506 may operate as a preferred power source for loads 504, with second power source 508 operating as a backup or alternate power source for loads 504. Although only two power sources 506, 508 for loads 504 are depicted in FIG. 1, STS 502 selectively couples loads 504 to any number of power sources in other embodiments. Further, although STS 502 is depicted as switching single phase Alternating Current (AC) power in FIG. 5, STS 502 switches 3-phase AC power in other embodiments. In 3-phase AC embodiments, first power source 506 and second power source 508 are 3-phase AC sources, and loads 504 are 3-phase AC load. In other embodiments, first power source 506 and second power source 508 are Direct Current (DC) sources, and loads 504 is a DC load. In other embodiments, first power source 506 and second power source 508 are 3-phase AC sources, and STS 502 supplies a plurality of single-phase AC loads (e.g., loads 504 are a plurality of single-phase AC loads). In this embodiment, loads 504 are selectively isolated from STS 502 via breakers 510. In particular, Load 504-1 is selectively isolated from STS 502 via breaker 510-1, load 504-2 is selectively isolated from STS 502 via breaker 510-2, and load 504-N is selectively isolated from STS 502 via breaker 510-N, where N is an arbitrary number of loads 504 and breakers 510.

In this embodiment, first power source 506 is electrically coupled to STS 502 at a first input 512 and second power source 508 is electrically coupled to STS 502 at a second input 514. Loads 504 are electrically coupled to an output 516 of STS 502 via their respective breakers 510.

In this embodiment, STS 502 further includes a first power stage 518, a second power stage 520, one or more control circuits 522, and one or more protection circuits 524. First and second power stages 518, 520 may comprise SiC MOSFETS, IGBTs, or other types of solid-state switches, which selectively couple first and second inputs 512, 514 with output 516, respectively. Control circuit 522 may operate similarly to control circuit 218 (see FIG. 2) and operate first and second power stages 518, 520 in a pulse conduction or pulse active mode during downstream electrical faults in order to allow sufficient time for one or more of breakers 510 to open and isolate a downstream electrical fault. Protection circuit 524 may operate similarly to protection circuit 216 to deactivate first or second power stages 518, 520 in response to a fault current exceeding an overcurrent protection threshold. In some embodiments, protection circuit 524 comprises a desaturation detection circuit as previously described for FIG. 2.

During operation of STS 502, only one of first and second power stages 518, 520 are active (conducting current) at a time, depending on whether loads 504 are powered by first power source 506 or second power source 508. For example, if first power source 506 is powering loads 504, then control circuit 522 operates first power stage 518 in an active mode (electrically conducting) and operates second power stage 520 is inactive mode (electrically non-conducting). If second power source 508 is powering loads 504, then control circuit 522 operates second power stage 520 in active mode and operates first power stage 518 in inactive mode.

When control circuit 522 detects a downstream electrical fault, by, for example, determining whether current at output 516 is higher than a threshold current and/or determining that the di/dt of the current at the output 516 is higher than a threshold rate, then control circuit 522 operates similar to control circuit 218 to transition either first or second power stages 518, 520 from a continuous active mode to a pulse active mode in order to limit the current through either the first or second power stages 518, 520 to less than the overcurrent protection threshold of the protection circuits 524. This allows breakers 510 in faulted zones to trip, while STS 502 continues to power loads 504 in the non-faulted zones.

In addition to the functionality described above for STS 502, STS 502 may, in some embodiments, utilize different current thresholds or different di/dt thresholds described above in order to temporarily operate first or second power stages 518, 520 in a pulse conduction/pulse active mode when an electrical fault is not present. For example, during startup, loads 504 may draw an inrush current that is less (in value and or in di/dt) than what would be detected as an electrical fault but more than normal, thereby allowing STS 502 to temporarily enter into a pulse conduction/pulse active mode of operation in order to limit the inrush current to loads 504. This type of additional functionality for STS 502 may improve the reliability of STS 502 by reducing the transient current stress on first and second power stages 518, 520.

An example technical effect of the apparatus and method described herein includes one or more of: (i) minimizing disruptions to downstream loads by continuing to power downstream loads during electrical faults; (ii) operating upstream SSCBs and STSs in a pulse conduction or pulse active mode during downstream faults in order to provide sufficient time for downstream breakers to trip; and (iii) limiting the inrush current associated with initially powering loads during transient current events.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A solid-state circuit breaker configured to current-limit a fault current during an electrical fault, the solid-state circuit breaker comprising:

an input configured to connect to a source;

an output configured to couple with a first load via a first electromechanical breaker and a second load via a second electromechanical breaker;

a solid-state switch selectively coupling the input with the output;

a protection circuit communicatively coupled with the solid-state switch and configured to open the solid-state switch in response to the fault current exceeding an overcurrent protection threshold for the solid-state switch; and a control circuit communicatively coupled with the solid-state switch and configured to:

determine whether a current through the solid-state switch reaches a pre-defined current threshold that is less than the overcurrent protection threshold;

in response to determining that the current through the solid-state switch reaches the pre-defined current threshold, operate the solid-state switch in a discontinuous current conduction mode during an electrical fault to current-limit the fault current to less than the pre-defined current threshold for the solid-state switch to prevent the protection circuit from opening the solid-state switch and enable one of the first and second electromechanical breakers to trip and isolate the electrical fault; and adjust a time during the discontinuous current conduction mode that the current through the solid-state switch is zero based on a type of the first and second electromechanical breakers.

2. The solid-state circuit breaker of claim 1, wherein: the control circuit is further configured to:

determine whether one of the first and second electromechanical breakers have tripped to isolate the electrical fault; and maintain the solid-state switch closed in response to one of the first and second electromechanical breakers tripping to isolate the electrical fault.

3. The solid-state circuit breaker of claim 1, wherein: the solid-state switch comprises a silicon carbide metal-oxide-semiconductor field-effect transistor (SiC MOSFET).

4. The solid-state circuit breaker of claim 1, wherein: the time during the discontinuous current conduction mode that the current through the solid-state switch is zero is between about five hundred microseconds to about one millisecond.

5. The solid-state circuit breaker of claim 1, wherein: the protection circuit comprises a desaturation detection circuit.

6. The solid-state circuit breaker of claim 1, wherein: the solid-state switch comprises a plurality of solid-state switches coupled in parallel with each other.

7. A static transfer switch comprising:

the solid-state circuit breaker of claim 1.

8. A method operable by a solid-state circuit breaker for current-limiting a fault current during an electrical fault, wherein:

the solid-state circuit breaker comprises:

an input configured to connect to a source;

an output configured to connect to a first load via a first electromechanical breaker and a second load via a second electromechanical breaker;

a solid-state switch selectively coupling the input with the output; and a protection circuit communicatively coupled with the solid-state switch and configured to open the solid-state switch in response to the fault current exceeding an overcurrent protection threshold for the solid-state switch, and wherein the method comprises:

determine whether a current through the solid-state switch reaches a pre-defined current threshold that is less than the overcurrent protection threshold;

in response to determining that the current through the solid-state switch reaches the pre-defined current threshold, operate the solid-state switch in a discontinuous current conduction mode during an electrical fault to current-limit the fault current to less than the pre-defined current threshold for the solid-state switch to prevent the protection circuit from opening the solid-state switch and enable one of the first and second electromechanical breakers to trip and isolate the electrical fault; and adjusting a time during the discontinuous current conduction mode that the current through the solid-state switch is zero based on a type of the first and second electromechanical breakers.

9. The method of claim 8, further comprising:

determining whether one of the first and second electromagnetic breakers have tripped to isolate the electrical fault; and maintain the solid-state switch closed in response to one of the first and second electromechanical breakers tripping to isolate the electrical fault.

10. The method of claim 8, wherein:

the solid-state switch comprises a silicon carbide metal-oxide-semiconductor field-effect transistor (SiC MOSFET).

11. The method of claim 8, wherein:

the time during the discontinuous current conduction mode that the current through the solid-state switch is zero is between about five hundred microseconds to about one millisecond.

12. The method of claim 8, wherein:

the protection circuit comprises a desaturation detection circuit.

13. The method of claim 8, wherein:

the solid-state switch comprises a plurality of solid-state switches coupled in parallel with each other.

14. A static transfer switch configured to current-limit a fault current during an electrical fault, the static transfer switch comprising:

first and second inputs configured to couple with first and second power sources, respectively;

an output configured to couple with at least a first load via a first electromechanical breaker and a second load via a second electromechanical breaker;

first and second power stages configured to conduct electrical power when active, wherein the first power stage is configured to selectively couple the first input with the output, and wherein the second power stage is configured to selectively couple the second input with the output;

at least one protection circuit configured to deactivate one of the first and second power stages in response to the fault current exceeding an overcurrent protection threshold for the first and second power stages; and a control circuit communicatively coupled with the first and second power stages and configured to:

determine whether a current through the first or second power stages reaches a pre-defined current threshold that is less than the overcurrent protection threshold;

in response to determining that the current through the first or second power stages reaches the pre-defined current threshold, operate one of the first and second power stages in a discontinuous current conduction mode during an electrical fault to current-limit the fault current to less than the pre-defined current threshold for the first and second power stages to prevent the at least one protection circuit from deactivating one of the first and second power stages until one of the first and second electromechanical breakers trips and isolates the electrical fault; and adjust a time during the discontinuous current conduction mode that the current through one of the first and second power stages is zero based on a type of the first and second electromechanical breakers.

15. The static transfer switch of claim 14, wherein:
the control circuit is further configured to:

determine whether one of the first and second electromechanical breakers have tripped to isolate the electrical fault; and maintain the one of the first and second power stages active in response to one of the first and second electromechanical breakers tripping to isolate the electrical fault.

16. The static transfer switch of claim 14, wherein:
the first and second power stages comprise silicon carbide metal-oxide-semiconductor field-effect transistors (SiC MOSFETs).

17. The static transfer switch of claim 14, wherein:
the time during the discontinuous current conduction mode that the current through one of the first and second power stages is zero is between about five hundred microseconds to about one millisecond.

18. The static transfer switch of claim 14, wherein:
the at least one protection circuit comprises at least one desaturation detection circuit.

19. The static transfer switch of claim 14, wherein:
the first and second power stages comprise silicon carbide metal-oxide-semiconductor field-effect transistors (SiC MOSFETs); and
the at least one protection circuit comprises at least one desaturation detection circuit.

20. The static transfer switch of claim 14, wherein:
the first and second power stages comprise insulated-gate bipolar transistors (IGBT); and
the at least one protection circuit comprises at least one desaturation detection circuit.

\* \* \* \* \*